(12) United States Patent
Chen et al.

(10) Patent No.: US 9,001,546 B2
(45) Date of Patent: Apr. 7, 2015

(54) 3D STRUCTURE FOR ADVANCED SRAM DESIGN TO AVOID HALF-SELECTED ISSUE

(71) Applicant: Taiwan Semiconductor Manufacturing Company Limited, Hsinchu (TW)

(72) Inventors: Chien-Yuan Chen, Hsinchu (TW); Chien-Yu Huang, Taoyuan County (TW); Hau-Tai Shieh, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 13/972,988

(22) Filed: Aug. 22, 2013

(65) Prior Publication Data

US 2015/0055402 A1    Feb. 26, 2015

(51) Int. Cl.
*G11C 5/02* (2006.01)
*G11C 5/06* (2006.01)

(52) U.S. Cl.
CPC .............. *G11C 5/06* (2013.01); *G11C 2213/71* (2013.01); *G11C 2213/78* (2013.01)

(58) Field of Classification Search
CPC ... G11C 5/06; G11C 2213/71; G11C 2213/78
USPC .......................... 365/51, 63, 154, 156, 230.06
See application file for complete search history.

(56) References Cited

U.S. PATENT DOCUMENTS

| | | | |
|---|---|---|---|
| 6,614,685 B2 * | 9/2003 | Wong .................. | 365/185.11 |
| 6,954,394 B2 * | 10/2005 | Knall et al. ................. | 365/211 |
| 7,142,471 B2 * | 11/2006 | Fasoli et al. .................. | 365/200 |
| 7,272,052 B2 * | 9/2007 | Scheuerlein et al. ..... | 365/185.23 |
| 7,280,397 B2 * | 10/2007 | Scheuerlein ............. | 365/185.08 |
| 7,327,590 B2 * | 2/2008 | Matsui et al. .................... | 365/51 |
| 7,359,279 B2 * | 4/2008 | Fasoli et al. ............... | 365/230.06 |
| 7,405,974 B2 * | 7/2008 | Yaoi et al. ................ | 365/185.12 |
| 7,590,024 B2 * | 9/2009 | Kang ........................ | 365/230.06 |
| 7,755,926 B2 * | 7/2010 | Tan et al. ....................... | 365/154 |
| 7,830,706 B2 * | 11/2010 | Hanzawa et al. .............. | 365/163 |
| 7,940,564 B2 * | 5/2011 | Park et al. ................ | 365/185.05 |
| 7,983,065 B2 * | 7/2011 | Samachisa ........................ | 365/51 |
| 8,054,665 B2 * | 11/2011 | Ahn et al. ......................... | 365/51 |
| 8,254,160 B2 * | 8/2012 | Murooka et al. .............. | 365/148 |
| 8,335,109 B2 * | 12/2012 | Seol et al. ................ | 365/185.17 |
| 8,345,464 B2 * | 1/2013 | Kang et al. ..................... | 365/148 |
| 8,553,445 B2 * | 10/2013 | Baek et al. ..................... | 365/148 |
| 8,611,121 B2 * | 12/2013 | Ahn et al. ......................... | 365/51 |
| 8,637,870 B2 * | 1/2014 | Scheuerlein et al. ........... | 257/74 |

* cited by examiner

*Primary Examiner* — Viet Q Nguyen
(74) *Attorney, Agent, or Firm* — Jones Day

(57) ABSTRACT

Disclosed is a novel static random access memory (SRAM) device. The SRAM device comprises a plurality of memory array layers vertically disposed one above another, a layer decoder circuit disposed on each memory array layer, a word line driver circuit disposed on each memory array layer, and a plurality of complementary bit line pairs wherein each complementary bit line pair extends vertically to couple a memory cell in each memory array layer. Each memory array layer comprises a plurality of memory cells and a word line disposed thereon. Each word line is connected to the plurality of memory cells disposed on its memory array layer. The number of memory cells in a layer corresponds to a predetermined memory page size. Each layer decoder circuit is configured to decode a portion of an SRAM address to select its memory array layer if the SRAM address corresponds to memory cells on its memory array layer. Each word line driver circuit is configured to drive the word line disposed on its memory array layer.

20 Claims, 6 Drawing Sheets

3D STRUCTURE FOR ADVANCED SRAM DESIGN TO AVOID HALF-SELECTED ISSUE

FIELD

The technology described in this patent document relates generally to SRAM devices and more particularly to a SRAM device structure having multiple semiconductor device layers that can avoid the half-selected issue with SRAM memory cells.

BACKGROUND

Static random access memory (SRAM) is commonly used in electronic devices. SRAM cells have the advantageous feature of holding data without a need for refreshing. SRAM cells may include different numbers of transistors, and are often accordingly referred to by the number of transistors, for example, six-transistor (6T) SRAM, eight-transistor (8T) SRAM, and the like. The transistors typically form a data latch for storing a data bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a data bit into a selected SRAM cell or reading a stored data bit from the selected SRAM cell.

SUMMARY

In accordance with the teachings described herein, provided are novel SRAM devices having multiple semiconductor-device layers. In one example, provided is static random access memory (SRAM) device that comprises a plurality of memory array layers vertically disposed one above another, a layer decoder circuit disposed on each memory array layer, a word line driver circuit disposed on each memory array layer, and a plurality of complementary bit line pairs wherein each complementary bit line pair extends vertically to couple a memory cell in each memory array layer. Each memory array layer comprises a plurality of memory cells and a word line disposed thereon. Each word line is connected to the plurality of memory cells disposed on its memory array layer. The number of memory cells in a layer corresponds to a predetermined memory page size. Each layer decoder circuit is configured to decode a portion of an SRAM address to select its memory array layer if the SRAM address corresponds to memory cells on its memory array layer. Each word line driver circuit is configured to drive the word line disposed on its memory array layer.

In another example, provided is static random access memory (SRAM) device that comprises a plurality of memory array layers vertically disposed one above another, a layer decoder circuit on each memory array layer, a word line driver configured to drive the word line disposed on a selected memory array layer, and a plurality of complementary bit line pairs, wherein each complementary bit line pair extends vertically to couple to a memory cell in each memory array layer. Each memory array layer comprises a plurality of memory cells and a word line disposed thereon. Each word line is connected to the plurality of the memory cells disposed on its memory array layer, wherein the number of memory cells in a layer corresponds to a predetermined memory page size. Each layer decoder circuit is configured to decode a portion of an SRAM address to select its memory array layer if the SRAM address corresponds to memory cells on its memory array layer. The SRAM device is configured to activate only the word line connected to those memory cells selected by the SRAM address so that a read operation or a write operation does not result in a non-selected memory cell consuming unnecessary power.

In another example, a method in a SRAM is provided comprising providing a plurality of memory array layers vertically disposed one above another. Each memory array layer comprises a plurality of memory cells. Each memory array layer further comprises a layer decoder. The layer decoder is configured to decode a portion of an SRAM address to determine the memory array layer on which the memory cells addressed by the SRAM address are disposed. The method further comprises providing a word line on each memory array layer, wherein each word line is connected to each memory cell in the memory array layer on which the word line is disposed. The method additionally comprises providing a plurality of complementary bit line pairs, each complementary bit line pair extending vertically to couple to a memory cell in each memory array layer. In addition, the number of memory cells that the word lines connect is equal to the number of input/output data lines in the device.

DETAILED DESCRIPTION

In advanced SRAM designs, it is desirable to use memory cells having small dimensions that operate on low power sources, and operate at high clock rates. As the memory cell density in memory arrays increase, memory arrays may be split into smaller sub-arrays due at least in part to a desire to reduce the length of bit lines. Splitting memory arrays into sub-arrays also results in additional SRAM management circuitry such as additional local input/output (I/O) circuitry and other local control circuitry. This can result in increased surface area on a die taken upon by the additional SRAM management circuitry. Also, in some designs to speed operation, memory arrays are divided up into banks and each bank decodes a portion of an SRAM address applied for a read operation or a write operation and activates the word lines of memory cells sharing the portion of the decoded address. A multiplexer would select the memory cells to be used for the memory operation. This can result in unnecessary power usage. For example, in a SRAM device having four memory banks, four word lines may be activated but the bit lines connected to memory cells on only one of the four word lines may be used. The bit lines in memory cells in the other three word lines would be in a low-powered state and may consume unnecessary power.

Figure 1:
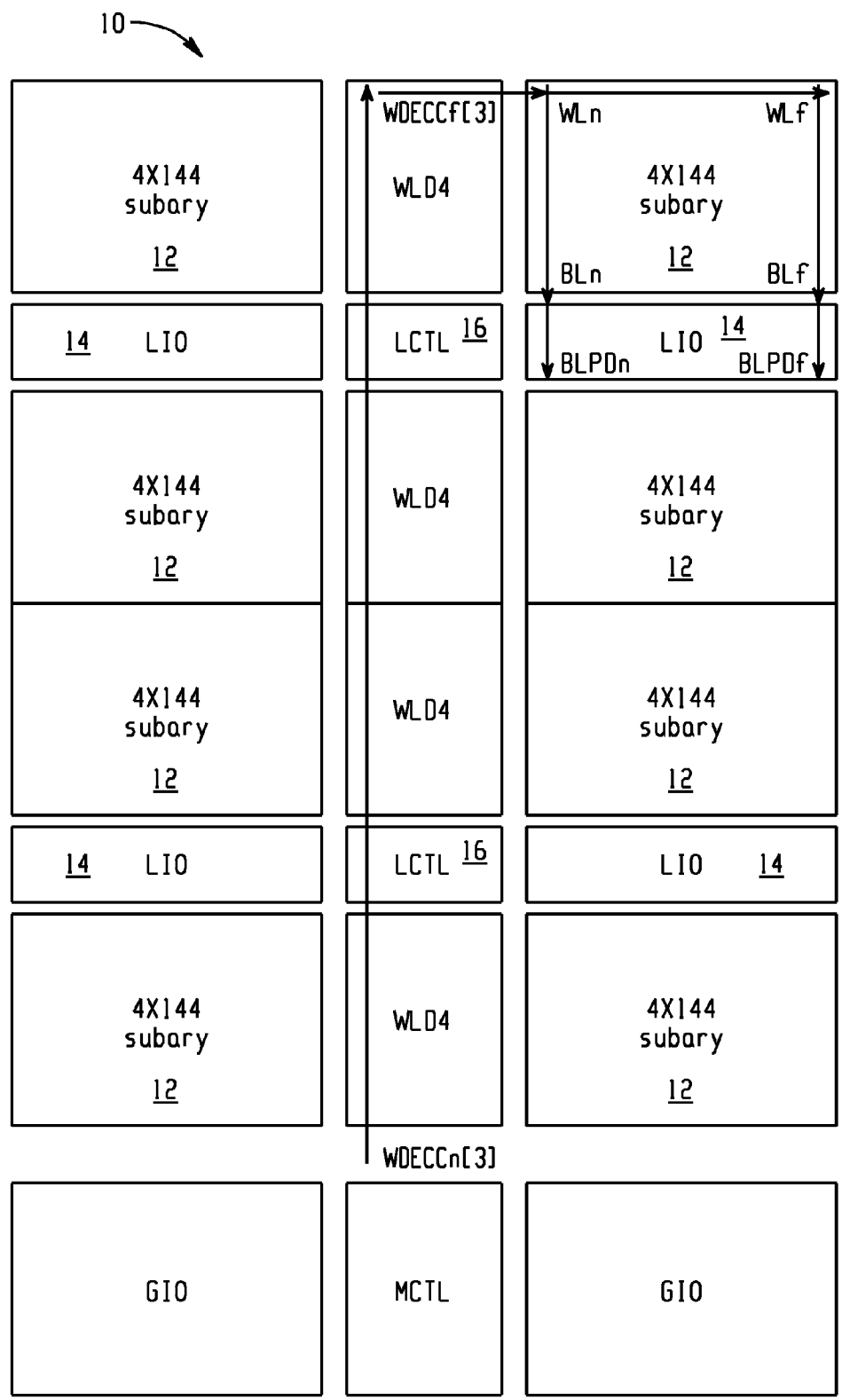
FIG. 1 is a block diagram of an example two dimension (2D) static random access memory (SRAM) structure.

Depicted in FIG. 1 is a block diagram of an example two dimension (2D) static random access memory (SRAM) structure 10. The example SRAM structure 10 is for a 64X288M4 SRAM. To shorten the bit lines, the memory array has been subdivided into four banks containing a total of 8 sub-arrays 12. Because the array has been divided into 8 sub-arrays, additional SRAM management circuits such as local I/O circuits (LIO) 14 and local control circuits (LCTL) 16 are supplied which results in the usage of additional surface area. 1152 bit lines are provided in this design. But only 288 bit lines are effective during a memory read or write operation. Consequently, dummy read behavior can occur with memory cells coupled to the remaining 864 bit lines. Dummy read behavior can result in unnecessary power consumption.

Figure 2:
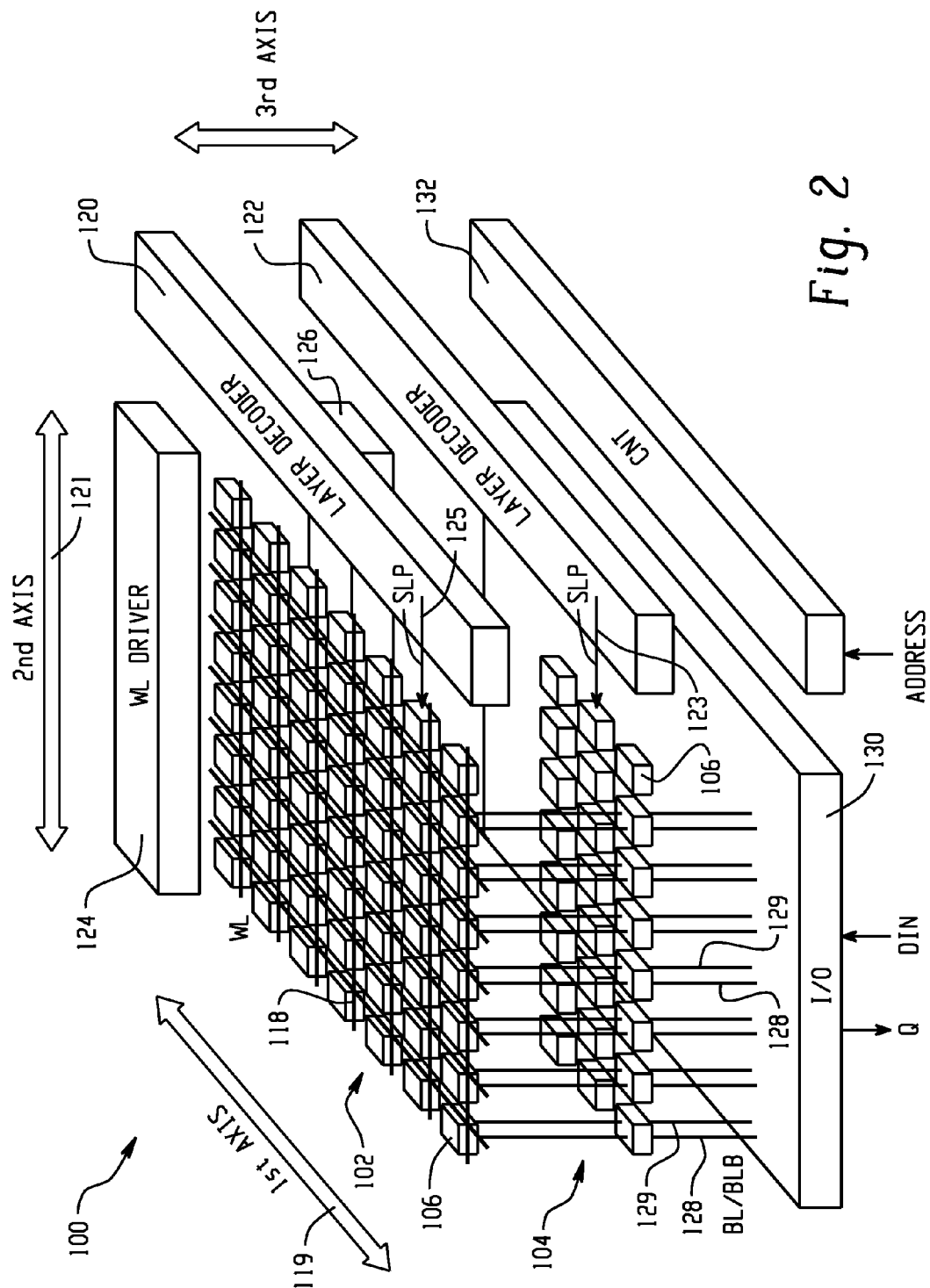
FIG. 2 is a block diagram of an example three dimension (3D) static random access memory (SRAM) structure.

Depicted in FIG. 2 is a block diagram of an example three dimension (3D) static random access memory (SRAM) structure. In many embodiments, greater surface area efficiency may be achieved using a 3D structure instead of a 2D structure. The example 3D SRAM structure 100 includes a plurality of memory array layers 102, 104 vertically disposed one above another. In this example two memory array layers 102, 104 are shown, but the 3D SRAM structure 100 may include additional memory array layers. The number of memory array layers can be set to be equal to the number of pages of memory in the SRAM structure. In some embodiments, the layer number is equal to the word depth.

Each memory array layer comprises a plurality of SRAM memory cells 106. The memory cells are for storing bits of data to be written to the SRAM or for outputting bits of data to be read from the SRAM. Multiple types of memory cells can be used.

Figure 3A:
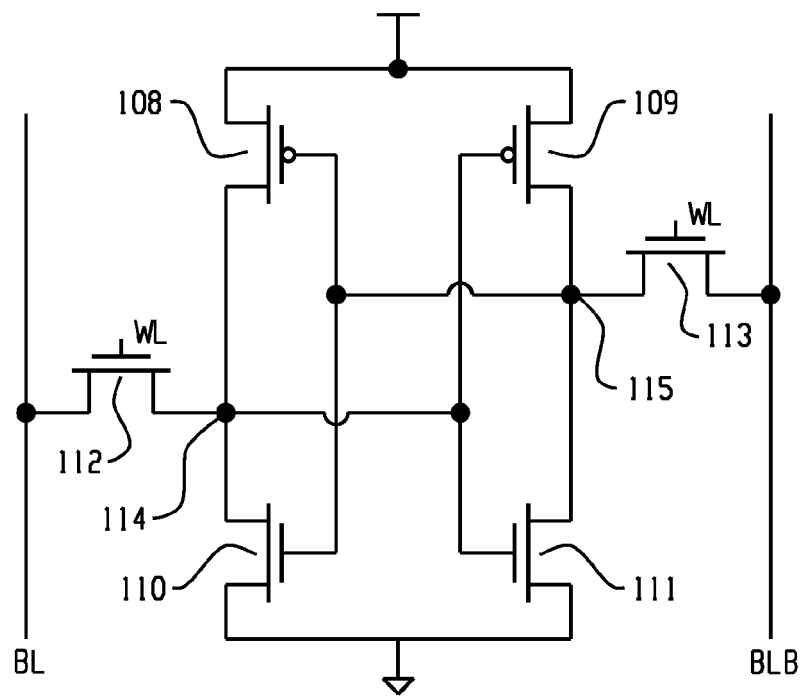
FIGS. 3A and 3B are schematic diagrams of example SRAM memory cells.
Figure 3B:
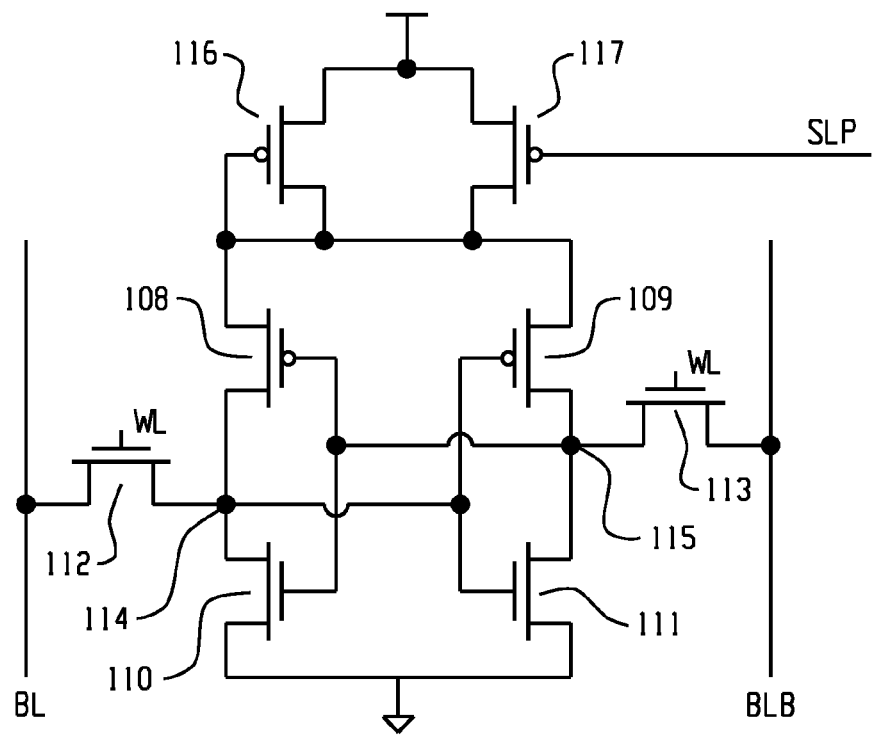

Depicted at FIGS. 3A and 3B are schematic diagrams of example SRAM memory cells that could be included in the example memory array layers 102, 104. FIG. 3A depicts a schematic diagram of a 6T SRAM memory cell that includes cross-coupled PMOS transistors 108, 109 and cross-couple NMOS transistors 110, 111. The example memory cell also includes pass transistors 112, 113 for selectively coupling storage nodes 114, 115, respectively to the complementary bit line pair (BL, BLB).

FIG. 3B depicts a schematic diagram of an 8T SRAM memory cell. Like the 6T SRAM memory cell of FIG. 3A, the 8T SRAM includes cross-coupled PMOS transistors 108, 109 and cross-couple NMOS transistors 110, 111. The example 8T memory cell also includes pass transistors 112, 113 for selectively coupling storage nodes 114, 115, respectively to the complementary bit line pair (BL, BLB). The example 8T memory cell also includes PMOS transistors 116, 117 coupled between the power source and the cross-coupled PMOS transistors 108, 109 for allowing the memory cell to operate in a reduced power Sleep or data retention mode. When the sleep (SLP) or data retention signal is inactive, such as when the memory cell is active for read or write operations, PMOS transistors 117 is turned on and provides a charging path for cross-coupled PMOS transistors 108, 109. When the sleep (SLP) signal is active, such as when the memory cell is inactive because other memory cells have been selected for read or write operations, PMOS transistors 117 is turned off and diode connected PMOS transistor 116 provides a charging path from the power source for cross-coupled PMOS transistors 108, 109 at a reduced voltage level. Although the example memory cells of FIGS. 3A and 3B are provided, other types of SRAM memory cells may be used in the memory array layers 102, 104. Also other types of data retention circuitry could be used with a memory cell.

Referring back to FIG. 2, each memory array layer 102, 104 also includes a word line 118 disposed thereon. Each word line 118 is connected to all of the memory cells in the memory array layer and can be used by the pass gates in those memory cells to determine when to selectively couple the memory cell storage nodes to the memory cell's associated complementary bit line pair. The number of cells for the layers is flexible. Each memory array layer contains a number of memory cells equal to the number of I/O lines in the SRAM structure. The number of cells for each memory array layer in the direction of the first axis is equal to a value A and the number of cells in the direction of the second axis is equal to a value B. The values of A and B are selected such that A×B equals the number of I/O lines in the SRAM structure.

The example 3D SRAM structure 100 also includes a layer decoder configured to decode a portion of an SRAM address supplied to the SRAM to determine the memory array layer on which the memory cells addressed by the SRAM address are disposed. The example layer decoder comprises a layer decoder circuit 120, 122 disposed on each memory array layer. Each layer decoder circuit 120, 122 is configured to decode a portion of the SRAM address to determine if the SRAM address corresponds to memory cells on its memory array layer. Additionally, in some embodiments, the layer decoder circuit on each memory array layer is configured to send a data retention signal (SLP) 123, 125 to each memory cell in its layer if the decoded SRAM address does not correspond to memory cells on its memory array layer. Page read operation and/or page write operation may be enabled using the layer decoder.

The example 3D SRAM structure 100 also includes a word line driver configured to drive one of the plurality of word lines disposed on one of the memory array layers. The example word line driver comprises a word line driver circuit 124, 126 disposed on each memory array layer. Each word line driver circuit 124, 126 is configured to drive the word line 118 disposed on its memory array layer when the layer decoder circuit disposed on its memory array layer determines that the SRAM address corresponds to memory cells on its memory array layer.

The layer decoder is additionally configured to allow the SRAM structure to activate only the word line connected to those memory cells selected by the SRAM address so that a read operation or a write operation does not result in a non-selected memory cell consuming unnecessary power. In many embodiments, lower power consumption may be achieved because the half-selected mode of operation for unselected memory cells may be eliminated.

The example 3D SRAM structure 100 also includes a plurality of complementary bit line pairs 128, 129. Each complementary bit line pair 128, 129 extends vertically to couple to a memory cell in each memory array layer. Although not shown completely in the figure, each memory cell in a memory array layer has a unique bit line pair to which it can couple and those bit line pairs couple to a single memory cell in each additional memory array layer. The number of bit line pairs is equal to the number of I/O lines in the SRAM structure.

The example 3D SRAM structure 100 also includes input/output (I/O) circuitry 130 and control circuitry 132. In this example, the I/O circuitry 130 and control circuitry 132 are disposed in a semiconductor layer below the memory array layers. Alternatively, the I/O circuitry 130 and/or control circuitry 132 can be disposed in a semiconductor layer above one or more of the memory array layers.

Figure 4:
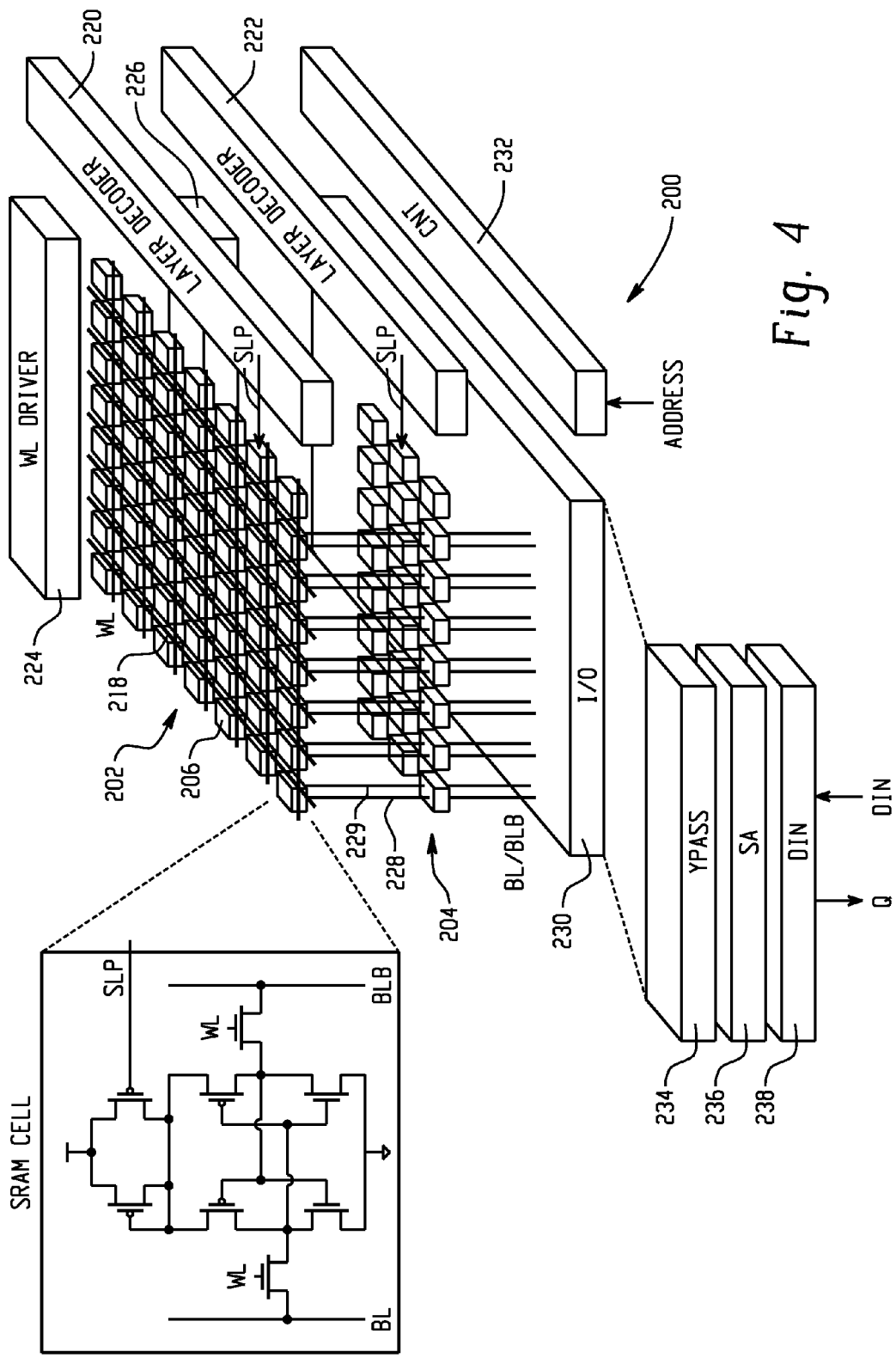
FIG. 4 is a block diagram of an example three dimension (3D) static random access memory (SRAM) structure illustrating that I/O circuitry can be separated into multiple parts and each part of the I/O circuitry disposed in a separate semiconductor layer above or below one or more of the memory array layers.

Depicted in FIG. 4 is a block diagram of another example three dimension (3D) static random access memory (SRAM) structure 200. The SRAM structure 200 is similar to the SRAM structure 100. The SRAM structure 200 also comprises a plurality of memory array layers 202, 204 vertically disposed one above another. Each memory array layer comprises a plurality of memory cells 206 and a word line 218 disposed thereon. The SRAM structure 200 further comprises a layer decoder 220, 222 configured to decode a portion of an SRAM address to determine the memory array layer on which the memory cells addressed by the SRAM address are disposed and a word line driver 224, 226 configured to drive one of the plurality of word lines. Additionally, the SRAM structure 200 comprises a plurality of complementary bit line pairs 228, 229 wherein each complementary bit line pair extends vertically to couple to a memory cell in each memory array layer. The SRAM structure 200 is also configured to activate only the word line connected to those memory cells selected by the SRAM address so that a read operation or a write operation does not result in a non-selected memory cell consuming unnecessary power The example 3D SRAM structure 200 also includes input/output (I/O) circuitry 230 and control circuitry 232. FIG. 4 illustrates that I/O circuitry 230 can be separated into multiple parts and each part of the I/O circuitry disposed in a separate semiconductor layer above or below one or more of the memory array layers. In this example, separate parts of the I/O circuitry 230, such as the YPASS circuitry 234, the sense amplifier circuitry 236, and the data in circuitry 238 are disposed in separate layers below the memory array layers. Also, control circuitry 232 can be disposed in a semiconductor layer above or below one or more of the memory array layers.

Figure 5:
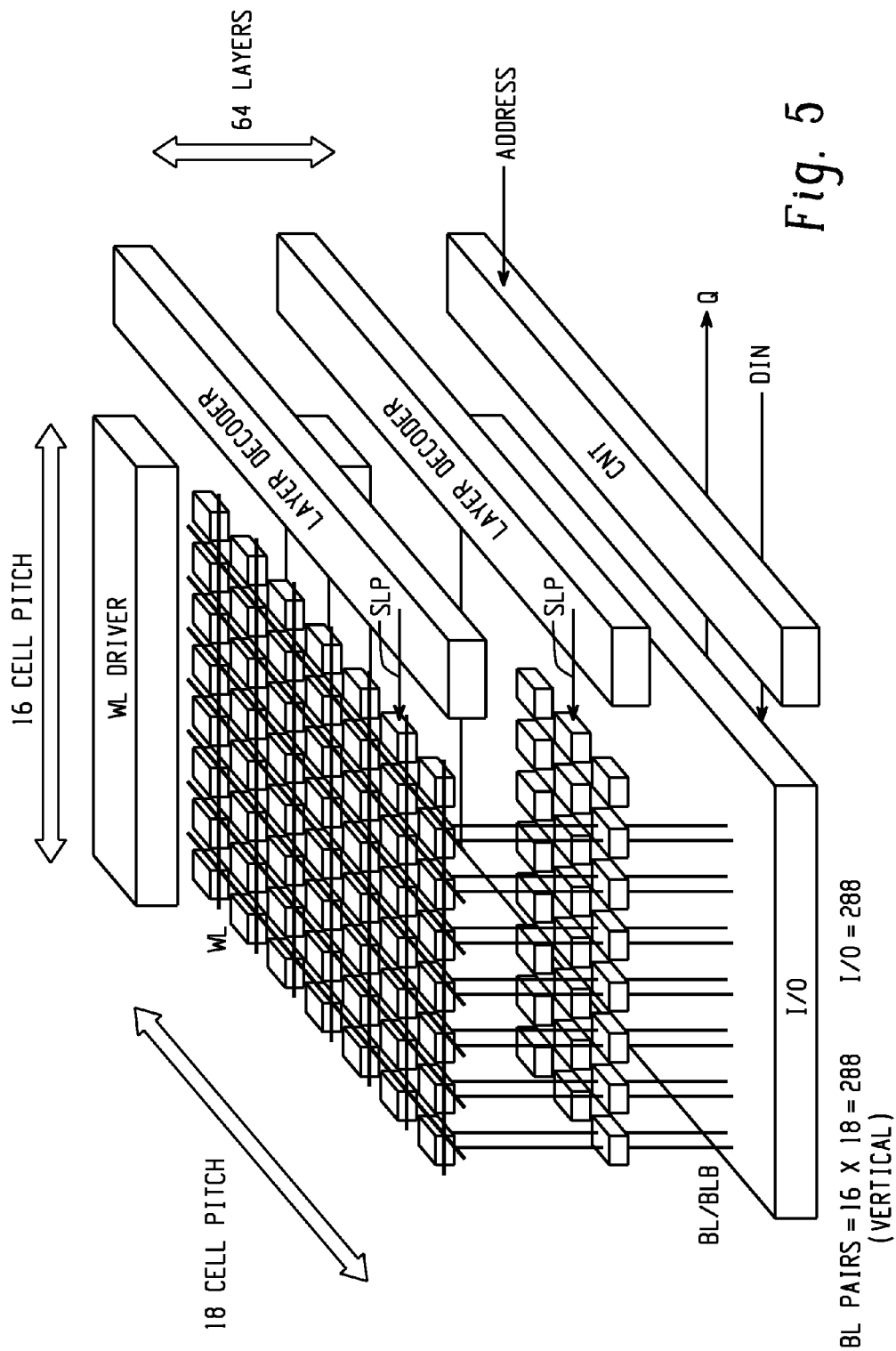
FIG. 5 is a block diagram of an example implementation of a 64X288M4 3D SRAM structure.

Depicted in FIG. 5 is a block diagram of an example implementation of a 64X288M4 3D SRAM structure 300. The SRAM structure 300 is similar to the SRAM structure 100. The SRAM structure 300 also comprises a plurality of memory array layers vertically disposed one above another. In this example implementation there are sixty-four memory array layers. The number of memory cells in each layer is 288 because the 64X288M4 has 288 I/O lines. The number of cells in the first axis has been chosen to be 18 and the number of cells in the second axis has been chosen to be 16 because 18 times 18 equals 288, which equals the number of I/O lines in the 64X288M4 SRAM. The number of bit line pairs is 288, which equals the number of memory cells in each layer.

Figure 6:
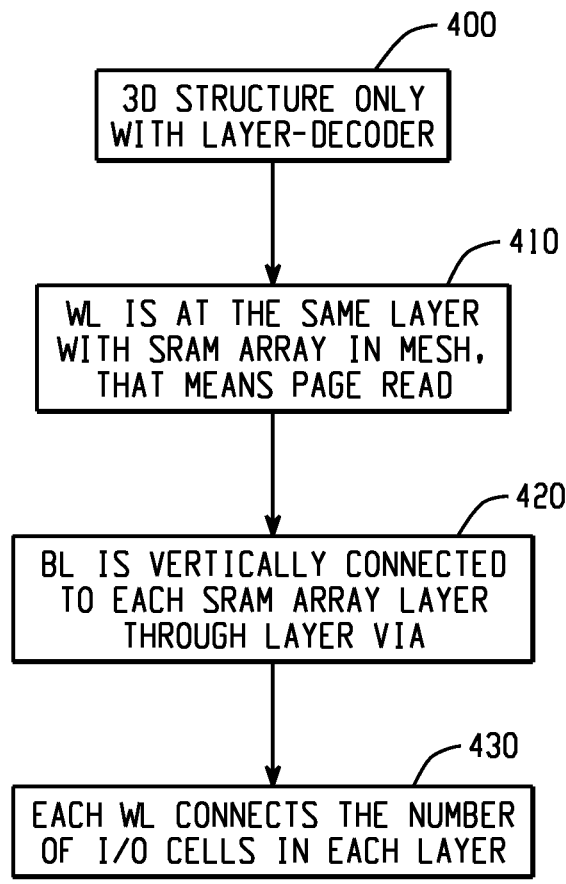
FIG. 6 is a flow diagram illustrating features of an example three dimension (3D) static random access memory (SRAM) structure.

Depicted in FIG. 6 is a diagram illustrating features of an example three dimension (3D) static random access memory (SRAM) structure. At operation 400, the diagram illustrates that this example 3D SRAM includes a layer-decoder. This example 3D SRAM does not include an x-decoder and y-decoder as in some 2D SRAMs. At operation 410, the diagram illustrates that each word line (WL) in the example 3D SRAM is on the same layer as the memory cells to which it connects and connects to all memory cells in the memory array layer in a mesh, which allows for page read operation. At operation 420, the diagram illustrates that each bit line (BL) in the example 3D SRAM connects to a memory cell in each layer through a layer via. At operation 430, the diagram illustrates that each word line (WL) selected by a memory address in the example 3D SRAM connects to all of the memory cells in the same layer and the number of memory cells in each layer is equal to the number of I/O data lines in the device. The word lines do not connect via multiplexers as in some 2D SRAM designs.

This written description uses examples to disclose the patentable scope of the described subject matter, including the best mode, and also to enable a person of ordinary skill in the art to make and use the patentable scope of the described subject matter. The patentable scope includes other examples.

In one example, provided is static random access memory (SRAM) device that comprises a plurality of memory array layers vertically disposed one above another, a layer decoder circuit disposed on each memory array layer, a word line driver circuit disposed on each memory array layer, and a plurality of complementary bit line pairs wherein each complementary bit line pair extends vertically to couple a memory cell in each memory array layer. Each memory array layer comprises a plurality of memory cells and a word line disposed thereon. Each word line is connected to the plurality of memory cells disposed on its memory array layer. The number of memory cells in a layer corresponds to a predetermined memory page size. Each layer decoder circuit is configured to decode a portion of an SRAM address to select its memory array layer if the SRAM address corresponds to memory cells on its memory array layer. Each word line driver circuit is configured to drive the word line disposed on its memory array layer.

In another example, provided is static random access memory (SRAM) device that comprises a plurality of memory array layers vertically disposed one above another, a layer decoder circuit on each memory array layer, a word line driver configured to drive the word line disposed on a selected memory array layer, and a plurality of complementary bit line pairs, wherein each complementary bit line pair extends vertically to couple to a memory cell in each memory array layer. Each memory array layer comprises a plurality of memory cells and a word line disposed thereon. Each word line is connected to the plurality of the memory cells disposed on its memory array layer, wherein the number of memory cells in a layer corresponds to a predetermined memory page size. Each layer decoder circuit is configured to decode a portion of an SRAM address to select its memory array layer if the SRAM address corresponds to memory cells on its memory array layer. The SRAM device is configured to activate only the word line connected to those memory cells selected by the SRAM address so that a read operation or a write operation does not result in a non-selected memory cell consuming unnecessary power.

In another example, a method in a SRAM is provided comprising providing a plurality of memory array layers vertically disposed one above another. Each memory array layer comprises a plurality of memory cells. Each memory array layer further comprises a layer decoder. The layer decoder is configured to decode a portion of an SRAM address to determine the memory array layer on which the memory cells addressed by the SRAM address are disposed. The method further comprises providing a word line on each memory array layer, wherein each word line is connected to each memory cell in the memory array layer on which the word line is disposed. The method additionally comprises providing a plurality of complementary bit line pairs, each complementary bit line pair extending vertically to couple to a memory cell in each memory array layer. In addition, the number of memory cells that the word lines connect is equal to the number of input/output data lines in the device.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A static random access memory (SRAM) device comprising:
    a plurality of memory array layers vertically disposed one above another, each memory array layer comprising a plurality of memory cells and a word line disposed thereon, each word line being connected to the plurality of memory cells disposed on its memory array layer, wherein the number of memory cells in a layer corresponds to a predetermined memory page size;
    a layer decoder circuit disposed on each memory array layer, each layer decoder circuit being configured to decode a portion of an SRAM address to select its memory array layer if the SRAM address corresponds to memory cells on its memory array layer;
    a word line driver circuit disposed on each memory array layer, each word line driver circuit being configured to drive the word line disposed on its memory array layer; and
    a plurality of complementary bit line pairs, each complementary bit line pair extending vertically to couple a memory cell in each memory array layer.

2. The SRAM device of claim 1, wherein the layer decoder circuitry on each memory array layer is operative to send a data retention signal to each memory cell in its layer if the SRAM address does not correspond to memory cells on its memory array layer.

3. The SRAM device of claim 2, wherein each memory cell comprises circuitry for putting the memory cell in a data retention mode when it receives a data retention signal.

4. The SRAM device of claim 3, wherein the circuitry for putting the memory cell in a data retention mode comprises a diode clamped MOSFET transistor coupled between the power source and the cross-coupled PMOS transistors in the memory cell.

5. The SRAM device of claim 1, further comprising input/output (I/O) circuitry disposed in a semiconductor layer above or below the memory array layers.

6. The SRAM device of claim 5, wherein the I/O circuitry is disposed in multiple semiconductor layers above or below the memory array layers.

7. The SRAM device of claim 1, wherein the memory array layers have a number of cells in a first direction and a number of cells in a second direction and the number of cells in the first direction times the number of cells in the second direction corresponds to the number of I/O data lines in the SRAM device.

8. The SRAM device of claim 1, wherein the number of memory array layers equals the number of memory pages for the SRAM device.

9. The SRAM device of claim 1, wherein memory cell selection by the layer decoder allows the SRAM device to perform a page read operation or a page write operation.

10. A static random access memory (SRAM) device comprising:
    a plurality of memory array layers vertically disposed one above another, each memory array layer comprising a plurality of memory cells and a word line disposed thereon, wherein each word line is connected to the plurality of the memory cells disposed on its memory array layer, wherein the number of memory cells in a layer corresponds to a predetermined memory page size;
    a layer decoder circuit on each memory array layer, each layer decoder circuit being configured to decode a portion of an SRAM address to select its memory array layer if the SRAM address corresponds to memory cells on its memory array layer;
    a word line driver configured to drive the word line disposed on the selected memory array layer; and
    a plurality of complementary bit line pairs, each complementary bit line pair extending vertically to couple to a memory cell in each memory array layer;
    wherein the SRAM device is configured to activate only the word line connected to those memory cells selected by the SRAM address so that a read operation or a write operation does not result in a non-selected memory cell consuming unnecessary power.

11. The SRAM device of claim 10, wherein the word line driver comprises a word line driver circuit disposed on each memory array layer, each word line driver circuit being configured to drive one of the plurality of word lines disposed on its memory array layer.

12. The SRAM device of claim 11, wherein each word line driver circuit is configured to drive the word line disposed on its memory array layer when the layer decoder circuit disposed on its memory array layer determines that the SRAM address corresponds to memory cells on its memory array layer.

13. The SRAM device of claim 11, wherein the layer decoder circuitry on each memory array layer is operative to send a data retention signal to each memory cell in its layer if the SRAM address does not correspond to memory cells on its memory array layer.

14. The SRAM device of claim 13, wherein each memory cell comprises circuitry for putting the memory cell in a data retention mode when it receives a data retention signal.

15. A method in a static random access memory (SRAM) device comprising:
    providing a plurality of memory array layers vertically disposed one above another, each memory array layer comprising a plurality of memory cells disposed thereon, each memory array layer further comprising a layer decoder configured to decode a portion of an SRAM address to determine the memory array layer on which the memory cells addressed by the SRAM address are disposed;

providing a word line on each memory array layer, wherein each word line is connected to each memory cell in the memory array layer on which the word line is disposed; and providing a plurality of complementary bit line pairs, each complementary bit line pair extending vertically to couple to a memory cell in each memory array layer;

wherein each word line is connected to a number of memory cells equal to the number of input/output data lines in the device.

16. The method of claim 15, further comprising:

providing a word line driver configured to operate cooperatively with the layer decoder to drive a word line connected to the memory cells addressed by the SRAM address.

17. The method of claim 16, wherein the word line driver comprises a word line driver circuit disposed on each memory array layer, each word line driver circuit being configured to the word line disposed on its memory array layer.

18. The method of claim 15, further comprising input/output (I/O) circuitry disposed in a semiconductor layer above or below the memory array layers, wherein the I/O circuitry is disposed in multiple semiconductor layers above or below the memory array layers.

19. The method of claim 15, wherein the layer decoder circuitry on each memory array layer is configured to send a data retention signal to each memory cell in its layer if the SRAM address does not correspond to memory cells on its memory array layer.

20. The method of claim 15, wherein the memory array layers have a number of cells in a first direction and a number of cells in a second direction and the number of cells in the first direction times the number of cells in the second direction corresponds to the number if I/O data lines in the SRAM device.

* * * * *